United States Patent
Kaplish

(10) Patent No.: US 11,921,533 B2
(45) Date of Patent: Mar. 5, 2024

(54) LOW-VOLTAGE COLLECTOR-FREE BANDGAP VOLTAGE GENERATOR DEVICE

(71) Applicant: Renesas Electronics America Inc., Milpitas, CA (US)

(72) Inventor: Anurag Kaplish, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 18/194,096

(22) Filed: Mar. 31, 2023

(65) Prior Publication Data
US 2023/0244261 A1   Aug. 3, 2023

Related U.S. Application Data

(62) Division of application No. 17/006,541, filed on Aug. 28, 2020.

(Continued)

(51) Int. Cl.
*G05F 3/22*     (2006.01)
*G05F 3/26*     (2006.01)
(Continued)

(52) U.S. Cl.
CPC .............. *G05F 3/225* (2013.01); *G05F 3/265* (2013.01); *H01L 29/732* (2013.01); *G05F 3/30* (2013.01); *H01L 29/7322* (2013.01)

(58) Field of Classification Search
CPC . G05F 3/225; G05F 3/265; G05F 3/30; H01L 29/732; H01L 29/7322
See application file for complete search history.

(56) References Cited

U.S. PATENT DOCUMENTS

| 5,512,817 A | 4/1996 | Nagaraj |
| 5,737,170 A | 4/1998 | Moyer |

(Continued)

FOREIGN PATENT DOCUMENTS

| DE | 23 16 599 A1 | 10/1973 |
| DE | 10 2006 061 512 A1 | 6/2008 |

(Continued)

OTHER PUBLICATIONS

Examination Report for European Application No. 20193973.3 dated Feb. 17, 2023.

(Continued)

*Primary Examiner* — Jue Zhang
(74) *Attorney, Agent, or Firm* — Foley & Lardner LLP

(57) ABSTRACT

Example implementations include a bandgap voltage device with a first current source operatively coupled to a bandgap input node and a bandgap output node and operable to output a first proportional-to-absolute-temperature (PTAT) current, a current mirror including a first bandgap transistor and a second bandgap transistor, and operatively coupled to the bandgap output node, and a second current source operatively coupled to the current mirror and operable to output a second PTAT current. Example implementations also include a bandgap transistor device with a first P+ layer proximate to a center of a planar surface of a transistor device, a first N+ layer at least partially surrounding the first P+ layer along the planar surface, a second P+ layer at least partially surrounding the first N+ layer along the planar surface, a second N+ layer at least partially surrounding the second P+ layer along the planar surface, and a third P+ layer at least partially surrounding the second N+ layer along the planar surface.

7 Claims, 6 Drawing Sheets

Related U.S. Application Data

(60) Provisional application No. 62/895,365, filed on Sep. 3, 2019.

(51) Int. Cl.
    *G05F 3/30*    (2006.01)
    *H01L 29/732*    (2006.01)

(56) References Cited

U.S. PATENT DOCUMENTS

| | | |
|---|---|---|
| 6,232,829 B1 | 5/2001 | Dow |
| 6,891,250 B1 | 5/2005 | Sakamoto |
| 7,208,930 B1 | 4/2007 | Tran et al. |
| 7,242,565 B2 | 7/2007 | Yoshio |
| 9,035,426 B2 | 5/2015 | Chang et al. |
| 2004/0041551 A1 | 3/2004 | Mottola et al. |
| 2005/0035813 A1 | 2/2005 | Xi |
| 2005/0285666 A1 | 12/2005 | Garlapati et al. |
| 2009/0302822 A1 | 12/2009 | Chao et al. |
| 2017/0125401 A1* | 5/2017 | Gu .................. H01L 21/266 |

FOREIGN PATENT DOCUMENTS

| | | |
|---|---|---|
| JP | H10-201080 A | 7/1998 |
| JP | 2010-086988 A | 4/2010 |

OTHER PUBLICATIONS

Examination Report for European Application No. 20193973.3 dated Jan. 29, 2021.
Examination Report for European Application No. 20193973.3 dated May 12, 2021.

\* cited by examiner

LOW-VOLTAGE COLLECTOR-FREE BANDGAP VOLTAGE GENERATOR DEVICE

CROSS-REFERENCE TO RELATED PATENT APPLICATIONS

This application is a divisional of U.S. patent application Ser. No. 17/006,541 filed Aug. 28, 2020, which claims priority to U.S. Provisional Patent Application Ser. No. 62/895,365, entitled "Low Voltage Collector Free Bandgap Voltage Reference," filed Sep. 3, 2019, the contents of such applications being hereby incorporated by reference in their entireties and for all purposes as if completely and fully set forth herein.

TECHNICAL FIELD

The present embodiments relate generally to power conversion, and more particularly to a low-voltage collector-free bandgap voltage generator device.

BACKGROUND

Supplying a stable voltage reference to an electrical or electronic system is a critical building block in most analog and mixed signal integrated circuits, including voltage regulators and data converters. A voltage reference must preferably be stable over process, voltage, and temperature variations. Low voltage operation of electrical or electronic system is desirable particularly for embedded, mobile, and like devices. However, conventional systems may not effectively generate a stable voltage reference at sufficiently low voltage. Thus, a technological solution for generating a stable reference voltage at low voltage is desired.

SUMMARY

Example implementations include a bandgap voltage device with a first current source operatively coupled to a bandgap input node and a bandgap output node and operable to output a first proportional-to-absolute-temperature (PTAT) current, a current mirror including a first bandgap transistor and a second bandgap transistor, and operatively coupled to the bandgap output node, and a second current source operatively coupled to the current mirror and operable to output a second PTAT current.

Example implementations also include a system comprising a proportional-to-absolute-temperature (PTAT) current generator, a bandgap voltage device operatively coupled to the PTAT current generator, a bandgap input node and a bandgap output node, and a current mirror including a first bandgap transistor and a second bandgap transistor, and operatively coupled to the PTAT current generator and the bandgap output node.

Example implementations also include a bandgap transistor device with a first P+ layer proximate to a center of a planar surface of a transistor device, a first N+ layer at least partially surrounding the first P+ layer along the planar surface, a second P+ layer at least partially surrounding the first N+ layer along the planar surface, a second N+ layer at least partially surrounding the second P+ layer along the planar surface, and a third P+ layer at least partially surrounding the second N+ layer along the planar surface.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
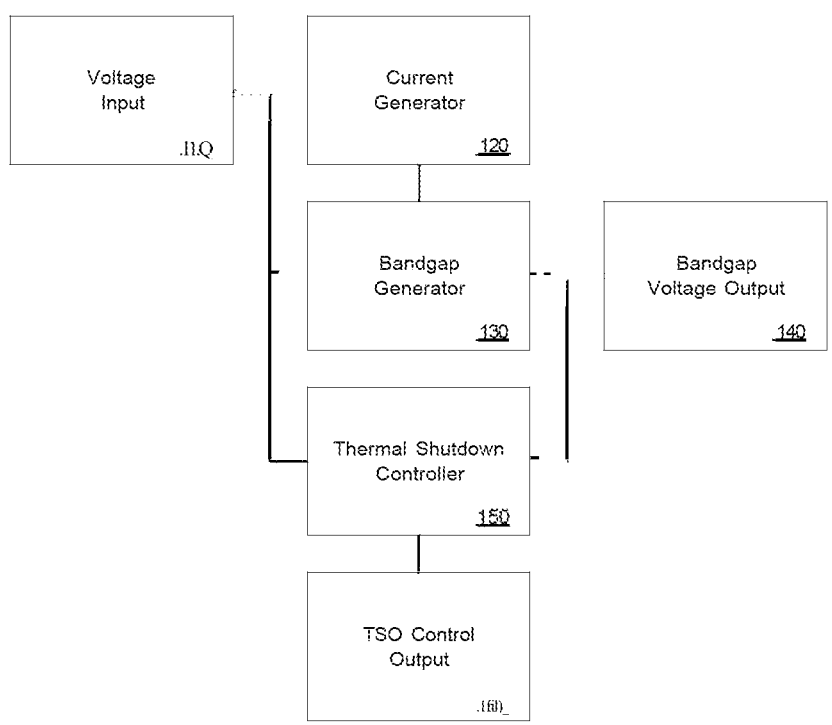
FIG. 1 illustrates an exemplary system in accordance with present implementations.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Implementations are directed to a low voltage bandgap voltage generator. In some implementations, low supply voltage operation is achieved at a bandgap voltage combined with a biasing transistor biasing voltage. In some implementations, the low supply voltage operation is achieved at 1.3 V and above, enabling stable bandgap at advantageously low operating voltage. In some implementations, exemplary systems provide a self-buffered output in which a bandgap generator device can source current. This way, no additional buffer is needed, where an additional or external buffer can degrade accuracy of the desired bandgap voltage. In some implementations, exemplary system are self-starting and thus require no dedicated startup circuit. In some implementations, exemplary systems allow low current operation and have a collector-free design. In an exemplary collector-free design, one or more n-well or N-buried layer pockets are connected to a supply. In this exemplary implementation, an exemplary system or device is resistant to minority carrier injection that can further decrease accuracy of the desired bandgap voltage. It is to be understood that any reference to a collector terminal herein with respect to a collector-free transistor device, device configuration, or the like, is understood to be a shorthand reference a transistor diagram, representation, or the like, and not limiting to any transistor requiring a terminal connector to a collector region, layer, or the like therein.

FIG. 1 illustrates an exemplary system in accordance with present implementations. As illustrated in FIG. 1, an exemplary system 100 includes an input voltage 110, a current generator 120, a bandgap generator 130, a bandgap voltage output 140, a thermal shutdown (TSD) controller 150, and a TSD control output 160. In some implementations, the exemplary system 100 is operable between −40° C. and +175° C. The input voltage 110 is operable to provide input power to one or more of the current generator 120, the bandgap generator 130, and the TSD controller 150. In some implementations, the input voltage 110 includes or provides at least one DC voltage to the exemplary system 100. In some implementations, the input voltage 110 ranges between 1.5 V and 5.5 V. The current generator 120 is operable to generate at least one constant or substantially constant current to one or more of the bandgap generator 130 and the TSD controller 150. In some implementations, the current generator 120 supplies a supply current equal to or proportional to a current generated by the current generator. In some implementations, one or more of the bandgap generator 130 and the TSD controller 150 receive the supply current. The bandgap generator 130 is operable to generate at least one constant or substantially constant bandgap voltage. In some implementations, the exemplary system 100 generates the bandgap output voltage 140 substantially constant to within one percent (±1%) of a predetermined bandgap voltage. In some implementations, the bandgap generator 130 is operable to generate an output of at least 10 µA. The TSD controller 150 is operable to generate the TSD control output 160 if operation of the exemplary system 100 is outside of a predetermined shutdown range. In some implementations, the TSD controller has a shutdown range between 151° C. and 165° C. In some implementations, the TSD control output 160 includes a logical high or logical low component generated from the TSD controller 150. In some implementations, the TSD control output is an inverted logical value that indicates a shutdown activation control output during a logical low state of the TSD control output 160, and normal operation during a logical high state of the TSD control output.

Figure 2:
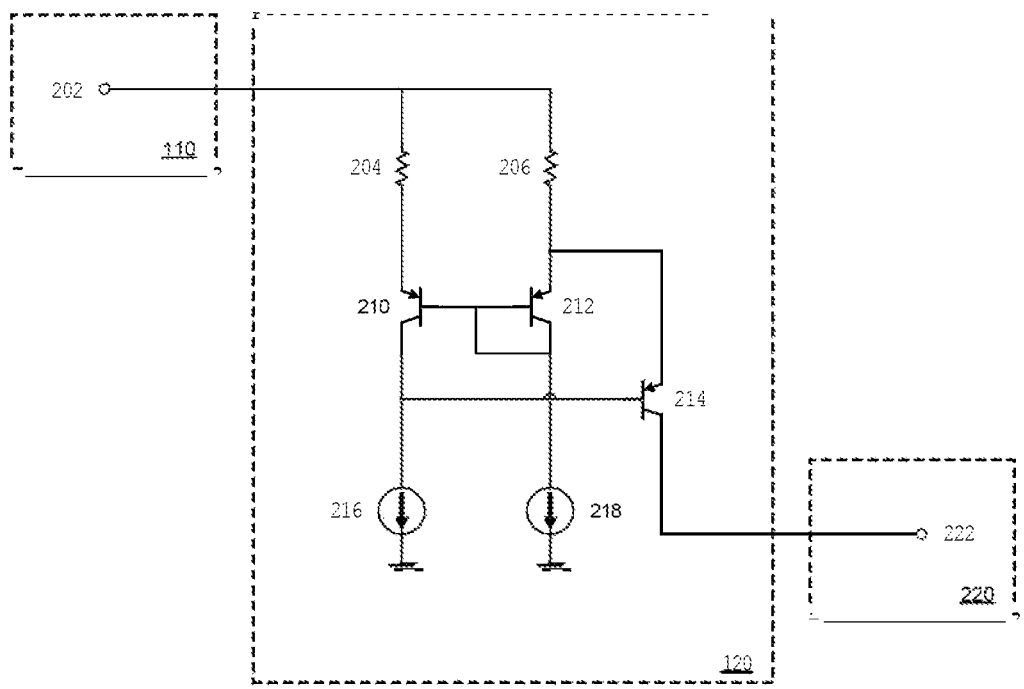
FIG. 2 illustrates an exemplary proportional to absolute temperature (PTAT) current generator device in accordance with present implementations.

FIG. 2 illustrates an exemplary proportional to absolute temperature (PTAT) current generator device in accordance with present implementations. As illustrated in FIG. 2, an exemplary circuit 200 corresponds to the current generator 120, and includes an input portion, a current mirror portion, a current source portion, and a current output portion.

The input portion includes input node 202 and resistors 204 and 206. In some implementations, the input node 202 is operable to receive at least an input voltage from the voltage input 110 and supply the input voltage to the resistors 204 and 206. In some implementations, the resistors 204 and 206 are operatively coupled to the input node 202 in parallel with each other. In some implementations, each of the resistors 204 and 206 is operatively coupled to the current mirror portion and the current output portion.

The current mirror portion includes transistors 210 and 212. In some implementations, each of the transistors 210 and 212 are respectively operatively coupled to the resistor 204 and the resistor 206. In some implementations, the transistors 210 and 212 are PNP transistors. In some implementations, the transistors 210 and 212 correspond to the exemplary transistor of FIGS. 5A and 5B. In some implementations, the resistors 204 and 206 are each operatively coupled to a respective emitter terminal of each of the transistors 210 and 212. In some implementations, respective base terminals of each of the transistors 210 and 212 are operatively coupled to each other. In some implementations, a collector terminal of at least one of the transistors 210 and 212 is operatively coupled to the base terminals of each of the transistors 210 and 212. In some implementations, the transistors 210 and 212 are operatively coupled to the current source portion. The current source portion includes current sources 216 and 218. In some implementations, the current sources 216 and 218 include one or more electrical, electronic, or like devices providing a predetermined constant current including one or more of a constant DC and AC current. In some implementations, each of the current sources 216 and 218 are respectively operatively coupled to a corresponding collector terminal of each of the transistors 210 and 212.

The current output portion includes transistor 214 and current output node 222. In some implementations, the transistor 214 is a PNP transistor. In some implementations, the transistor 214 corresponds to the exemplary transistor of FIGS. 5A and 5B. In some implementations, an emitter terminal of the transistor 214 is operatively coupled to an emitter node of at least one of the transistors 210 and 212. In some implementations, a base terminal of the transistor 214 is operatively coupled to a collector node of at least one of the transistors 210 and 212. In some implementations, a collector node of the transistor 214 is operatively coupled to the current output node 222. In some implementations, the current output node 222 is operable to output a proportional-to-absolute-temperature (PTAT) current as a current output 220.

Figure 3:
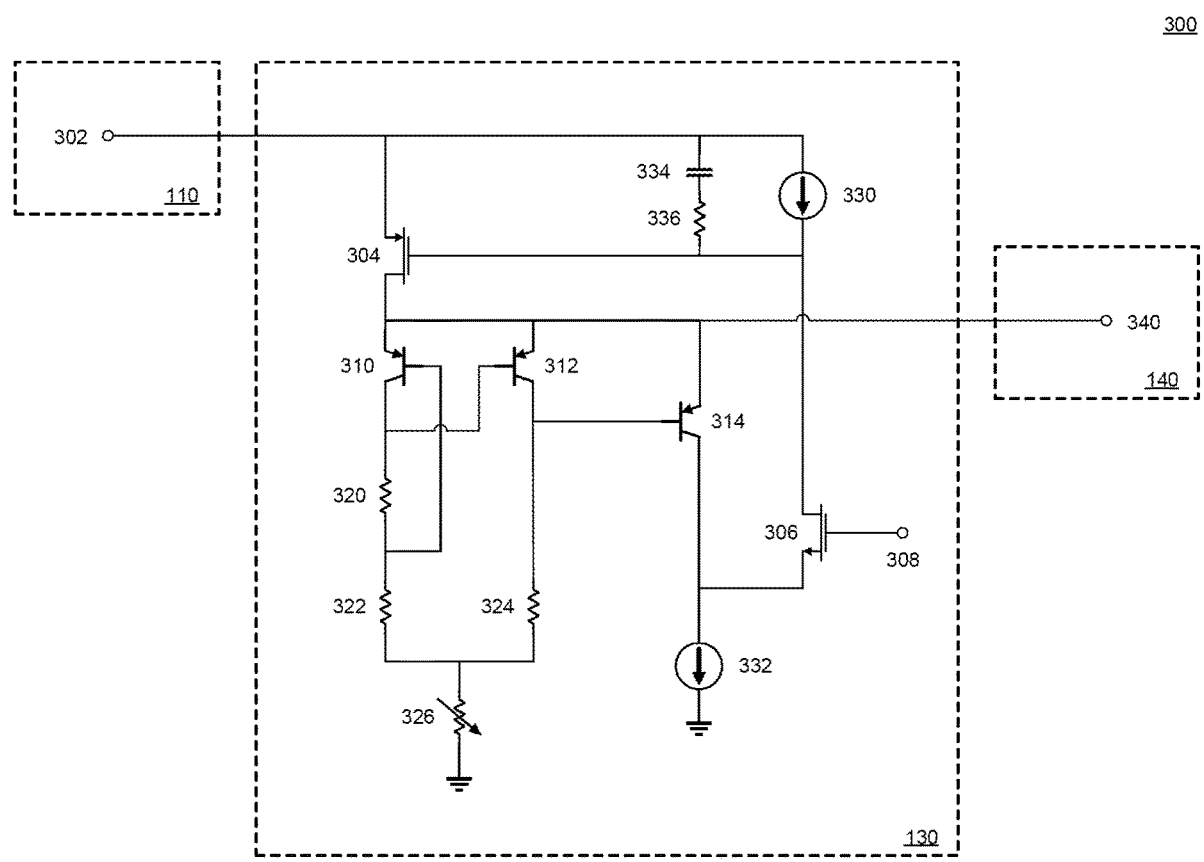
FIG. 3 illustrates an exemplary bandgap voltage generator device in accordance with present implementations.

FIG. 3 illustrates an exemplary bandgap voltage generator device in accordance with present implementations. As illustrated in FIG. 3, an exemplary circuit 300 includes an input portion, a current mirror portion, a biasing portion, and an output portion.

The input portion includes bandgap input node 302, transistor 304, current source 330, capacitor 334, and resistor 336. In some implementations, the bandgap input node 302 is operable to receive at least an input voltage from the voltage input 110 and supply the input voltage to the transistor 304 and the current source 330. In some implementations, the transistor 304 is a field-effect transistor (FET). In some implementations, a source terminal of the transistor 304 is operatively coupled to one or more of the bandgap input node 302 and the current source 330. In some implementations, a gate terminal of the transistor 304 is operatively coupled to the current source 330. In some implementations, a drain terminal of the transistor 304 is operatively coupled to one or more of the current mirror portion, the biasing portion, and the output portion. In some implementations, the current source 300 is operable to output a current equal to, substantially equal to, or corresponding to the proportional-to-absolute-temperature (PTAT) current output by the exemplary circuit 200. In some implementations, the capacitor 334 and the resistor 336 are operatively coupled in series with each other and in parallel with the current source 330. In some implementations, the capacitor 334 and the resistor 336 comprise a compensation circuit.

The current mirror portion includes transistors 310 and 312, and resistors 320, 322, 324 and 326. In some implementations, each of the transistors 310 and 312 are operatively coupled to the transistor 304, the current source 330, the biasing portion, and the output portion. In some implementations, the transistors 310 and 312 are PNP transistors. In some implementations, the transistors 310 and 312 correspond to the exemplary transistor of FIGS. 5A and 5B. In some implementations, the resistors 320 and 324 are each operatively coupled to a respective collector terminal of each of the transistors 310 and 312. In some implementations, a collector terminal of the transistor 310 is operatively coupled to a base terminal of the transistor 312. In some implementations, a base terminal of the transistor 312 is operatively coupled to a collector terminal of the transistor 310. In some implementations, the resistors 320 and 322 are arranged in series with the collector terminal of the transistor 310, and the base terminal of the transistor 310 is operatively coupled to a node disposed between the resistors 320 and 322. In some implementations, the resistors 320 and 322 comprise a voltage divider. In some implementations, the resistors 322, 324 and 326 are operatively coupled to each other, with the resistors 322 and 324 in parallel with each other and in series with the resistor 326. In some implementations, the resistor 326 is a variable resistor. In some implementations, the resistor 326 is operable to configure, calibrate, or the like, the exemplary circuit 300 to output a predetermined bandgap output voltage. In some implementations, the resistor 326 is operable to configure, calibrate, or the like, the exemplary circuit 300 by compensating for an electrical characteristic of one or more component of the exemplary circuit 300.

The biasing portion includes transistor 306, transistor 314 and current source 332. In some implementations, the transistor 306 is a field-effect transistor (FET). In some implementations, the transistor 306 is operably coupled to a biasing node 308, and is operable to receive a biasing voltage therefrom. In some implementations, a source terminal of the transistor 306 is operatively coupled to the current source 332 and the transistor 314. In some implementations, a drain terminal of the transistor 306 is operatively coupled to one or more of an output of the current source 330 and a gate terminal of the transistor 304. In some implementations, the transistor 314 is a PNP transistor. In some implementations, the transistor 314 corresponds to the exemplary transistor of FIGS. 5A and 5B. In some implementations, a collector terminal of the transistor 314 is operatively coupled to one or more of an input of the current source 332 and a source terminal of the transistor 306. In some implementations, a base terminal of the transistor 314 is operatively coupled to one or more of a collector terminal of the transistor 312 and the resistor 324. In some implementations, an emitter node of the transistor 314 is operatively coupled to emitter nodes of one or more of the transistors 310 and 312, and to the output portion. The output portion includes a bandgap voltage output node 340 operable to supply the bandgap voltage output 140. In some implementations, the current source 332 is operable to output a current double to or substantially double to the proportional-to-absolute-temperature (PTAT) current output by the exemplary circuit 200.

In some implementations, one or more of the current sources 330 and 332 is operatively to generate, supply, or the like, a current in accordance with the current output 220. In some implementations, one or more of the current sources 330 and 332 includes one or more electrical, electronic, or like devices operable to receive the current output 220 and supply the current output 220 to the exemplary circuit 300. Alternatively, in some implementations, one or more of the current sources 330 and 332 includes one or more electrical, electronic, or like devices operable to generate a current based on one or more characteristics of the current output 220 and supply the generated current to the exemplary circuit 300.

Figure 4:
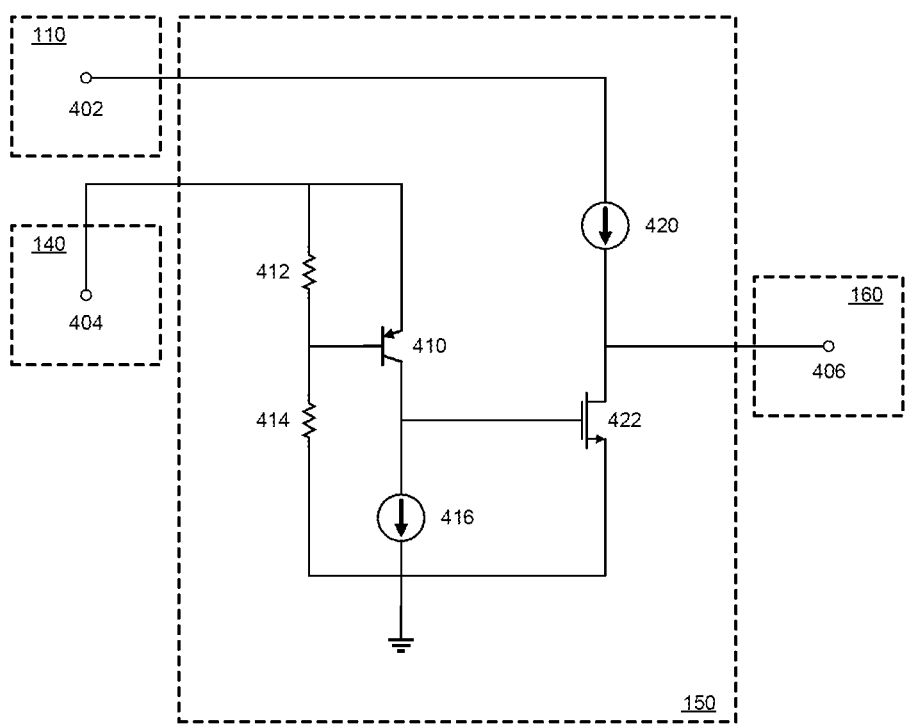
FIG. 4 illustrates an exemplary thermal shutdown (TSD) controller device in accordance with present implementations.

FIG. 4 illustrates an exemplary thermal shutdown (TSD) controller device in accordance with present implementations. As illustrated in FIG. 4, an exemplary circuit 400 includes a TSD input portion, a TSD signal generator portion, and a TSD output portion. The TSD input portion includes a TSD input node 402 and a current source 420. In some implementations, the TSD input node 402 is operable to receive the voltage input 110. In some implementations, the current source 420 is operably coupled to the TSD input node 402 at an input thereof and is operable to receive the voltage input 110 at the input thereof.

The TSD signal generator portion includes bandgap voltage input node 404, resistors 412 and 414, transistor 410, and current source 416. In some implementations, the bandgap voltage input node is operable to receive the bandgap voltage output 140. In some implementations, the bandgap voltage input node 404 is operably coupled to the bandgap voltage output node 340 of the exemplary circuit 300. In some implementations, the bandgap voltage input node 404 is operably coupled to one or more of the resistor 412 and the transistor 410. In some implementations, the transistor 410 is a PNP transistor. In some implementations, the transistor 410 corresponds to the exemplary transistor of FIGS. 5A and 5B. In some implementations, an emitter terminal of the transistor 410 is operatively coupled to the bandgap voltage input node 404 and the resistor 412. In some implementations, a collector terminal of the transistor 410 is operatively coupled to the current source 416. In some implementations, the current source 416 is operable to output a current equal to, substantially equal to, or corresponding to the proportional-to-absolute-temperature (PTAT) current output by the exemplary circuit 200. In some implementations, a base terminal of the transistor 410 is operably coupled to the resistors 412 and 414. In some implementations, the resistors 412 and 414 comprise a voltage divider circuit.

The TSD output portion includes a transistor 422 and a TSD output node 406. In some implementations, the transistor 422 is a field-effect transistor (FET). In some implementations, a gate terminal of the transistor 422 is operably coupled to the collector terminal of the transistor 410 and an input terminal of the current source 416. In some implementations, a source terminal of the transistor 422 is operably coupled to an output of the current source 416 and the resistor 414. In some implementations, the TSD output node 406 is operably coupled to one or more of an output node of the current source 420 and the drain terminal of the transistor 422. In some implementations, the TSD output node 406 supplies the TSD control output 160.

In some implementations, one or more of the current sources 416 and 420 is operatively to generate, supply, or the like, a current in accordance with the current output 220. In some implementations, one or more of the current sources 416 and 420 includes one or more electrical, electronic, or like devices operable to receive the current output 220 and supply the current output 220 to the exemplary circuit 400. Alternatively, in some implementations, one or more of the current sources 416 and 420 includes one or more electrical, electronic, or like devices operable to generate a current based on one or more characteristics of the current output 220 and supply the generated current to the exemplary circuit 400.

Figure 5A:
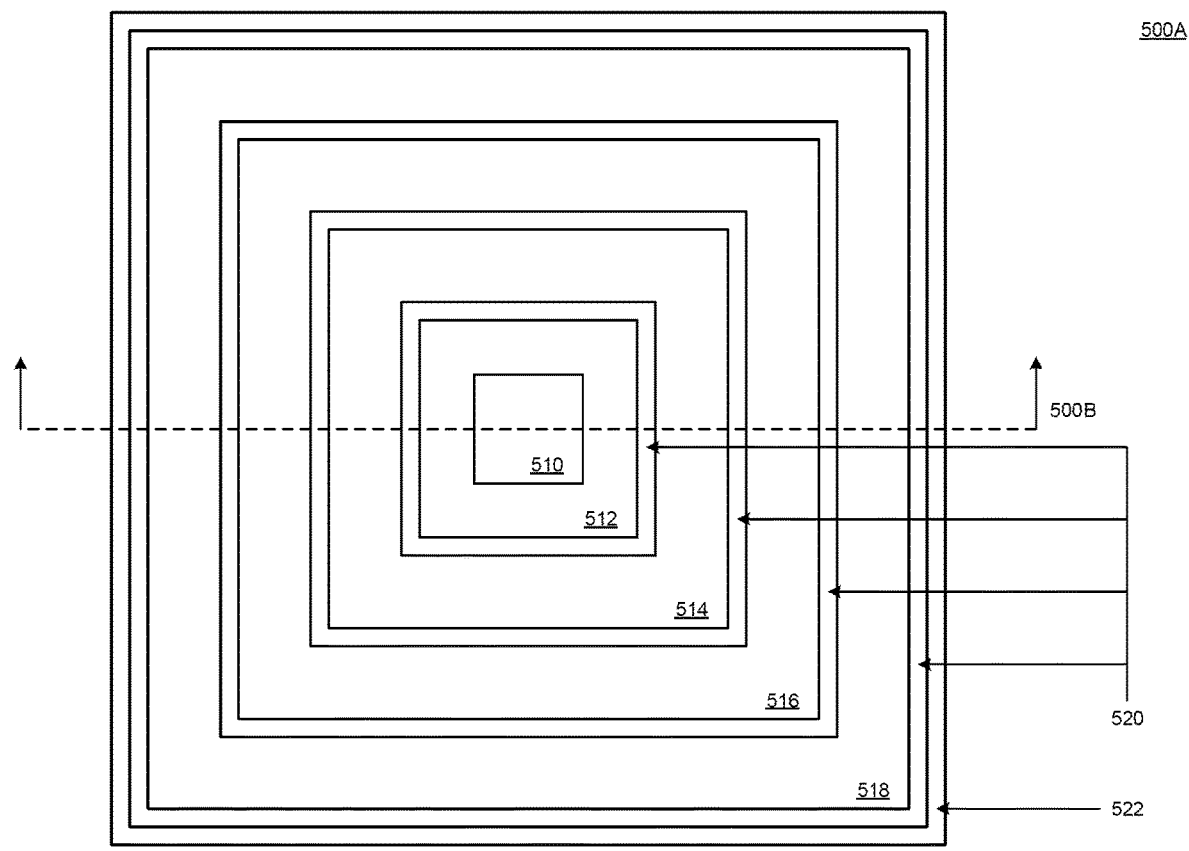
FIG. 5A illustrates a plan view of an exemplary transistor device operable in accordance with one the system of FIG. 1 and the devices of FIGS. 2-4.

FIG. 5A illustrates a plan view of an exemplary transistor device operable in accordance with one the system of FIG. 1 and the devices of FIGS. 2-4. As illustrated in plan view 500A of FIG. 5A, an exemplary transistor device includes an emitter region, a base region, a collector region, an outer N-type region, an outer P-type region, and a device wall region. In some implementations, the exemplary transistor device is a pnp transistor. In some implementations, the exemplary transistor is a bipolar-junction transistor or the like. In some implementations, the exemplary transistor is connectable to one or more electrode pads including one or more conducting, insulating, semiconducting, or like layers. In some implementations, one or more bandgap transistors are comprised in accordance with the exemplary transistor of FIGS. 5A and 5B. Thus, the exemplary transistor can be included at least in one or more of the current generator 120, the bandgap generator 130, and the TSD controller 150. In some implementations, one or more transistors of one or more of the current generator 120, the bandgap generator 130, and the TSD controller 150 are comprised in accordance with the exemplary transistor of FIGS. 5A and 5B. Thus, in some implementations, advantages of the present implementations are achieved by the integration of the exemplary transistor of FIGS. 5A and 5B with one or more of the system 100 and the devices 200, 300 and 400.

The emitter region can include one or more emitter layers 510. In some implementations, the emitter layer is formed on or over a semiconductor substrate by one or more semiconductor or polymer layers. In some implementations, the emitter region is located at or proximate to a center of a planar surface of a transistor device. As one example, a planar surface of a semiconductor device can comprise a face of a semiconductor wafer or portion thereof subsequent to slicing thereof. In some implementations, the emitter layer is formed on an upper surface of the exemplary semiconductor device comprising the planar surface. In some implementations, the emitter region 510 is contactable with at least one emitter electrode pad, lead, or the like to comprise an emitter electrode terminal of a semiconductor device.

The base region can include a base layer 512, and is at least partially surrounded by a first shallow trench (ST) layer 520. In some implementations, the base region 512 includes at least one N+ doped semiconductor layer material. In some implementations, the base region 512 at least partially surrounds the emitter layer 510 along the planar surface. In some implementations, the base layer 512 is adjacent to the emitter layers 510 along the planar surface of the exemplary device. In some implementations, the base region 512 is contactable with at least one base electrode pad, lead, or the like to comprise a base electrode terminal of a semiconductor device. In some implementations, the first ST layer 520 partially surrounds the base layer 512 to at least partially electrically isolate the base layer 512 from one or more layers proximate thereto.

The collector region can include a collector layer 514, and is at least partially surrounded by a second ST layer 520. In some implementations, the collector layer 514 includes at least one P+ doped semiconductor layer material. In some implementations, the collector layer 514 at least partially surrounds the base layer 512 and the first ST layer 520 along the planar surface. In some implementations, the first ST layer 520 at least partially electrically isolates the base layer 512 from the collector layer 514. In some implementations, the collector layer 514 is adjacent to the first ST layer 520 along the planar surface of the exemplary device. In some implementations, the collector layer 514 is contactable with at least one collector electrode pad, lead, or the like to comprise a collector electrode terminal of a semiconductor device. In some implementations, the second ST layer 520 partially surrounds the collector layer 514 to at least partially electrically isolate the collector layer 514 from one or more layers proximate thereto.

The outer N-type region can include an outer N-doped layer 516, and is at least partially surrounded by a third ST layer 520. In some implementations, the outer N-doped layer 516 includes at least one N+ doped semiconductor layer material. In some implementations, the outer N-doped layer 516 at least partially surrounds the collector layer 514 and the second ST layer 520 along the planar surface. In some implementations, the second ST layer 520 at least partially electrically isolates the collector layer 514 from the outer N-doped layer 516. In some implementations, the outer N-doped layer 516 is adjacent to the second ST layer 520 along the planar surface of the exemplary device. In some implementations, the outer N-doped layer 516 is contactable with at least one N-type electrode pad, lead, or the like to comprise an N-type electrode terminal of a semiconductor device. In some implementations, the one or more N-type electrode pads are operatively coupled to one or more of the emitter layers 510, the base layer 512, and the collector layer 516. In some implementations, the third ST layer 520 partially surrounds the outer N-doped layer 516 to at least partially electrically isolate the outer N-doped layer 516 from one or more layers proximate thereto.

The outer P-type region can include an outer P-doped layer 518, and is at least partially surrounded by a fourth ST layer 520. In some implementations, the outer P-doped layer 518 includes at least one P+doped semiconductor layer material. In some implementations, the outer P-doped layer 518 at least partially surrounds the outer N-doped layer 516 and the third ST layer 520 along the planar surface. In some implementations, the third ST layer 520 at least partially electrically isolates the outer N-doped layer 516 from the outer P-doped layer 518. In some implementations, the outer P-doped layer 518 is adjacent to the third ST layer 520 along the planar surface of the exemplary device. In some implementations, the outer P-doped layer 518 is contactable with at least one P-type electrode pad, lead, or the like to comprise a P-type electrode terminal of a semiconductor device. In some implementations, the one or more P-type electrode pads are operatively coupled to one or more of the emitter layers 510, the base layer 512, and the collector layer 516. In some implementations, the fourth ST layer 520 partially surrounds the outer P-doped layer 518 to at least partially electrically isolate the outer P-doped layer 518 from one or more device boundaries including the device wall region.

The device wall region can include substrate material 522. In some implementations, the substrate material 522 includes at least one epitaxial wafer (epi) semiconductor layer material. In some implementations, the substrate material is formed as a semiconductor wafer and is sliced or otherwise separated into a plurality of semiconductor devices long a plane through the substrate material perpendicular to the plane of 500A parallel to the planar surface of the exemplary semiconductor device.

Figure 5B:
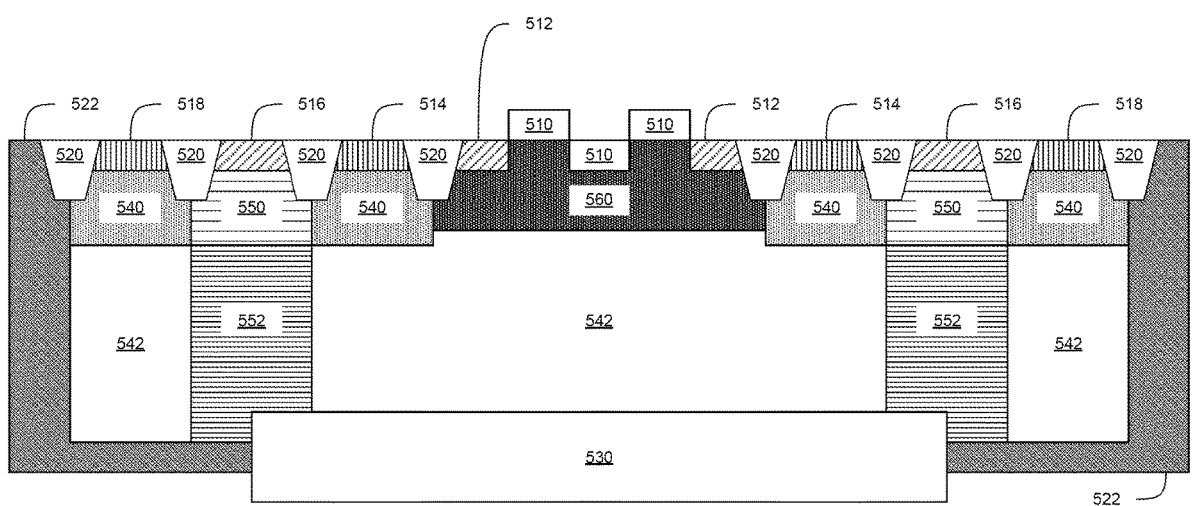
FIG. 5B illustrates a cross-sectional view of the exemplary transistor device of FIG. 5A.

FIG. 5B illustrates a cross-sectional view of the exemplary transistor device of FIG. 5A. As illustrated in cross-sectional view 500B of FIG. 5B, an exemplary transistor device includes the emitter region, the base region, the collector region, the outer N-type region, the outer P-type region, the device wall region, and a substrate region.

The emitter region can further include a plurality of contact portions comprising the emitter layers 510. In some implementations, the plurality of contact portions of the emitter layers 510 comprise an embedded emitter layer and an emitter layer structure. In some implementations, the embedded emitter layer includes at least one P+ doped semiconductor layer material. In some implementations, the embedded emitter layer is disposed at or proximate to the center of the planar surface of a transistor device. In some implementations, the emitter layer structure includes at least one polymer or semiconductor layer material. In some implementations, the emitter layer structure at least partially surrounds the embedded emitter along the planar surface. In some implementations, the emitter layer structure is disposed substantial above the planar surface of the semiconductor device and the embedded emitter layer. In some implementations, the embedded emitter layer and the emitter layer structure are formed by one or more interdependent or independent semiconductor fabrication steps as are known or may become known.

The base region can further include a high voltage N-type diffused drain (HVNDD) layer 560. In some implementations, the HVNDD layer 560 is disposed within the semiconductor device and at least partially below the emitter layers 510 and the base layer 512. In some implementations, one or more of the embedded emitter layer of the emitter layers 510 and the base layer 512 is at least partially embedded within the HVNDD layer 560. In some implementations, the emitter layer structure of the emitter layers 510 is disposed at least partial above and in contact with the HVNDD layer 560. It is to be understood that the HVNDD layer 560 can include additional materials therein. It is to be further understood that the HVNDD layer 560 can include any material or materials possessing at least one high voltage N-type diffused drain characteristic, property, or the like.

The collector region can further include a first p-well layer 540. In some implementations, the first p-well layer 540 is disposed within the semiconductor device and at least partially below the collector layer 514. In some implementations, the collector layer 514 is at least partially embedded within the first p-well layer 540. In some implementations, the first ST layer 520 further at least partially electrically isolates the HVNDD layer 560 from the first p-well layer 540. It is to be understood that the first p-well layer 540 can include additional materials therein. It is to be further understood that the first p-well layer 540 can include any material or materials possessing at least one p-well characteristic, property, or the like.

The outer N-type region can further include an n-well layer 550 and a high voltage n-well (HVNW) layer 552. In some implementations, the n-well layer 550 is disposed within the semiconductor device and at least partially below the outer N-doped layer 516. In some implementations, the outer N-doped layer 516 is at least partially embedded within the n-well layer 550. In some implementations, the second ST layer 520 further at least partially electrically isolates the first p-well layer 540 from the n-well layer 550. It is to be understood that the n-well layer 550 can include additional materials therein. It is to be further understood that the n-well layer 550 can include any material or materials possessing at least one n-well characteristic, property, or the like. In some implementations, the HVNW layer 552 is disposed within the semiconductor device and at least partially below the n-well layer 550. In some implementations, the n-well layer 550 is at least partially embedded within the HVNW layer 552. It is to be understood that the HVNW layer 552 can include additional materials therein. It is to be further understood that the HVNW layer 552 can include any material or materials possessing at least one n-well characteristic, property, or the like.

The outer P-type region can further include a second p-well layer 540 and an outer high voltage p-well (HVPW) layer 542. In some implementations, the second p-well layer 540 is disposed within the semiconductor device and at least partially above the outer HVPW layer 542. In some implementations, the second p-well layer 540 is at least partially embedded within the outer HVPW layer 542. In some implementations, the third ST layer 520 further at least partially electrically isolates the n-well layer 550 from the second p-well layer 540. It is to be understood that the second p-well layer 540 can include additional materials therein. It is to be further understood that the second p-well layer 540 can include any material or materials possessing at least one p-well characteristic, property, or the like. In some implementations, the outer HVPW layer 542 is disposed within the semiconductor device and at least partially below the second p-well layer 540. In some implementations, the second p-well layer 540 is at least partially embedded within the outer HVPW layer 542. It is to be understood that the outer HVPW layer 542 can include additional materials therein. It is to be further understood that the outer HVPW layer 542 can include any material or materials possessing at least one p-well characteristic, property, or the like.

The substrate region can include the substrate material 522 of the device wall region, an inner high voltage p-well (HVPW) layer 542 and an N-buried layer (NBL) 530. In some implementations, the substrate material 522 comprises a device wall extending along a height of the exemplary transistor device of FIGS. 500A and 500B. In some implementations, the inner HVPW layer 542 includes a doped region formed concurrently with the outer doped region 542. In some implementations, the HVNW layer 552 is formed within an intermediate HVPW layer including the inner HVPW layer and the outer HVPW layer 542, to subsequently form distinct inner and outer HVPW layers 542. It is to be understood that the inner HVPW layer 542 can include additional materials therein. It is to be further understood that the inner HVPW layer 542 can include any material or materials possessing at least one p-well characteristic, property, or the like. In some implementations, the NBL 530 is integrated into one or more of the substrate material 522, the inner HVPW layer 542, and the HVNW layer 552. The NBL 530 can be doped in accordance with at least one N+, N−, or like type. It is to be understood, however, that the NBL 530 can include additional materials therein. It is to be further understood that the NBL 530 can include any material or materials possessing at least one n-type characteristic, property, or the like.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A bandgap voltage device comprising:
   a first current source operatively coupled to a bandgap input node and a bandgap output node, and operable to output a first proportional-to-absolute-temperature (PTAT) current;
   a current mirror including a first bandgap transistor and a second bandgap transistor, and operatively coupled to the bandgap output node; and
   a second current source operatively coupled to the current mirror, and operable to output a second PTAT current,
   wherein the first bandgap, transistor and the second bandgap transistor each comprise a bipolar junction transistor, and
   wherein the bipolar junction transistor comprises a first P+ layer proximate to a center of a planar surface of the transistor device.

2. The bandgap voltage device of claim 1, wherein the bipolar junction transistor further comprises a first N+ layer at least partially surrounding the plurality of emitter layers, and a second P+ layer at least partially surrounding the first N+ layer.

3. The bandgap voltage device of claim 2, wherein the bipolar junction transistor further comprises a second N+ layer at least partially surrounding the second P+ layer, and a third P+ layer at least partially surrounding the second N+ layer.

4. A bandgap transistor device, comprising:
   a first P+ layer proximate to a center of a planar surface of a transistor device; and
   a first N+ layer at least partially surrounding the first P+ layer along the planar surface.
   a second P+ layer at least partially surrounding the first N+ layer along the planar surface;
   a second N+ layer at least partially surrounding the second P+ layer along the planar surface; and a third P+ layer at least partially surrounding the second N+ layer along the planar surface.

5. The bandgap transistor device of claim 4 further comprising:
a high voltage p-well region disposed below the first P+ layer, the first N+ layer, and the second P+ layer.

6. The bandgap transistor device of claim 4 wherein a first bandgap transistor comprises a first instance of the bandgap transistor device and a second bandgap transistor comprises a second instance of the bandgap transistor device, and
wherein a bandgap voltage device includes a first current source operatively coupled to a bandgap input node and a bandgap output node, a current mirror including the first bandgap transistor and the second bandgap transistor and operatively coupled to the bandgap output node, and a second current source operatively coupled to the current mirror.

7. The bandgap transistor device of claim 6, wherein a third bandgap transistor comprises a third instance of the bandgap transistor device, and
wherein the third bandgap transistor operatively is coupled to the bandgap output node, the first current source, and the current mirror.

\* \* \* \* \*